United States Patent [19]

McKoon et al.

[11] 4,262,160

[45] Apr. 14, 1981

[54] EVAPORATOR FEED

[75] Inventors: Robert H. McKoon, El Cerrito; P. A. Joel Smith, San Pablo, both of Calif.

[73] Assignee: Jersey Nuclear-Avco Isotopes, Inc., Bellevue, Wash.

[21] Appl. No.: 58,529

[22] Filed: Jul. 18, 1979

[51] Int. Cl.³ .......................................... H01J 37/305
[52] U.S. Cl. ................................................. 13/31 EB
[58] Field of Search ............... 13/31, 31 EB; 250/427, 250/492 B, 284, 288, 298

[56] References Cited

U.S. PATENT DOCUMENTS 4,035,574  7/1977  Kennedy ................................. 13/31

*Primary Examiner*—Roy N. Envall, Jr.
*Attorney, Agent, or Firm*—Weingarten, Maxham & Schurgin

[57] ABSTRACT

Apparatus and method for supplying feedstock to a reservoir containing material having a portion which is heated to a molten condition and vaporized by an electron beam. The electron beam is supplied from a heated filament and directed to impact on the vapor source material by electric and magnetic fields. The feedstock is suspended above a portion of the reservoir out of the path of the electron beam. Skip electrons along with some secondary electrons emitted from the surface of the material in the vicinity of the region of electron beam impact, together with radiant heating therefrom, are utilized to melt an exposed portion of the feedstock, allowing it to drip into the reservoir, and replenish the supply of material which is depleted by vaporization. Vaporization is maintained substantially uniform from the region of electron beam impact and splatter of the feedstock is largely avoided.

13 Claims, 3 Drawing Figures

EVAPORATOR FEED

FIELD OF THE INVENTION

This invention relates in general to supplying feedstock to apparatus for vaporizing a supply of material and, more particularly, to supplying uranium feedstock to an electron beam furnace of the type employed to provide vaporized uranium for isotopic enrichment thereof.

BACKGROUND OF THE INVENTION

Electron beam furnaces, also termed electron beam evaporators, have heretofore been employed in applications in which it is desired to vaporize a solid material. In particular, in the field of isotopic enrichment of uranium, it has previously been recognized, as shown for example in U.S. Pat. Nos. 3,939,354, and 4,058,667, that a beam of electrons may be impacted upon a reservoir containing a stock of uranium. An electron gun, comprising in part a heated filament, is employed as the source of the electron beam. The electron beam is directed onto and heats the uranium in the region of the beam impact and melts a portion thereof, to create a molten pool of uranium of limited extent. Such localized heating limits the region of melting and permits the remainder of the material in the reservoir to act as a heat sink for the molten pool. Evaporation from the surface of the liquefied pool provides a source of uranium vapor. The vapor will contain multiple isotopes of uranium and, by processes such as those disclosed in the aforementioned patents, desired isotopes may be selectively excited and collected therefrom.

Since vaporization will deplete the stock of uranium acted upon by the electron beam, it is necessary to either continuously or from time to time replenish the supply of uranium in the reservoir. One previous method of doing so on a more or less continuous basis has been to suspend feedstock for replenishing the uranium supply above the material being vaporized, and then to heat the feedstock and allow it to slowly drip into the vapor source supply. This, of course, requires a mechanism for heating and melting the feedstock. In the field of isotopic enrichment, the principal manner of melting the feedstock has heretofore been to place the feedstock in such a position as to intercept a portion of the primary beam of electrons. Unfortunately, this causes the feedstock to spatter, rather than to drip cleanly. A selected isotope of the vaporized material is collected in enriched proportions by separately condensing particles having the isotope on cooled surfaces disposed above the evaporator. Since such collection surfaces are situated in direct line of sight of the reservoir, the spattering results in unprocessed material being collected on these surfaces, thereby decreasing the isotopic selectivity of the separation and the amount of enrichment otherwise achievable.

Alternatively, heat for melting the feedstock has been derived in other prior art systems by radiation from the heated, molten pool. This, however, creates a cold spot in the pool in the vicinity of the feedstock; the result is an undesirable non-uniformity or perturbation of the vapor distribution emanating from the evaporator.

BRIEF SUMMARY OF THE INVENTION

The disadvantages of the prior art methods alluded to above are intended to be substantially alleviated by the present invention. It has been found that by proper positioning of the feed point and proper design of the feeder, the feed stock may be heated by non-primary electrons secondarily emitted from or skipped off of the surface of the liquid pool, rather than by the primary electron beam provided by the electron gun. Due to the presence of a uniform magnetic field which is used to direct the primary electron beam from the electron gun onto the source material, non-primary electrons emitted from the surface of the uranium at the point of primary beam impact assume a trajectory having a radius of curvature defined by the intensity of the magnetic field and the electron velocities which vary greatly. The feedstock is placed so as to intercept a sustantial number of the trajectories of these non-primary electrons, so as to be impacted and heated thereby.

To limit the melting of the feedstock to its end region, a water-cooled feeder tube surrounds the feedstock for most of its length, to dissipate a substantial amount of the energy absorbed from the non-primary electrons. Melting is thereby limited to the small, uncooled end portion of the feedstock which extends out beyond the water-cooled feeder tube and into the non-primary electron stream, above the surface of the source material. A drive system permits the feedstock to be pushed through the feeder tube and into the area where the stream of the non-primary electrons is intercepted. The drive may either be manually controlled or automatic. In the latter situation, the level of material in the reservoir is monitored and a drive motor is actuated responsive to the condition indicated by the monitor, so that the material supply is automatically replenished as it becomes depleted by vaporization.

Radiant energy from the hearth is also absorbed by the feedstock, further contributing to the melting thereof. In contrast with the above-described prior art, however, the point of introduction of the feedstock is sufficiently removed from the region of vapor generation in the evaporator so as not to distort substantially the uniformity of the vapor distribution which is produced. The melting produced by the technique disclosed herein also results in less spatter of the melting feedstock, since the non-primary beam of electrons is much softer, i.e. less dense and less concentrated, than the primary beam.

Further, in the preferred application, a multi-phase system is present in the reservoir as described in commonly assigned U.S. Pat. No. 4,035,574. Here, a narrow width pool of molten material is surrounded by an unliquefied multi-phase region at a temperature higher than the melting point of the feedstock. The feedstock, upon melting, then need only drip onto the multi-phase region surrounding the liquid pool; it then diffuses through the multi-phase region to reach the liquid pool. This further reduces spattering. As explained in the aforesaid U.S. patent, the multi-phase system is provided by a melt comprising a uranium saturated, porous mass bulk. The porous mass is typically formed of a finely divided or powdered material having a much lower vapor pressure than that of the uranium to be evaporated. The uranium is saturated into the porous mass and is melted by the application of the electron beam.

It is also noted that in the prior art the non-primary electrons are often captured on a water-cooled shield. By making use of the non-primary electron beam, as shown herein, some of the energy in that beam is used to perform useful work and less remains to be dissipated by the water-cooled shield. This accordingly reduces the heat load which is put on the material reservoir. It is therefore to be realized that the present invention results in more efficient utilization of the energy in the primary electron beam than is taught in the prior art.

BRIEF DESCRIPTION OF THE DRAWING

These and other features of the present invention are more fully described below in the detailed description of the preferred embodiment, presented for purposes of illustration and not by way of limitation, and in the accompanying drawings in which.

DETAILED DESCRIPTION OF THE INVENTION

Figure 1:
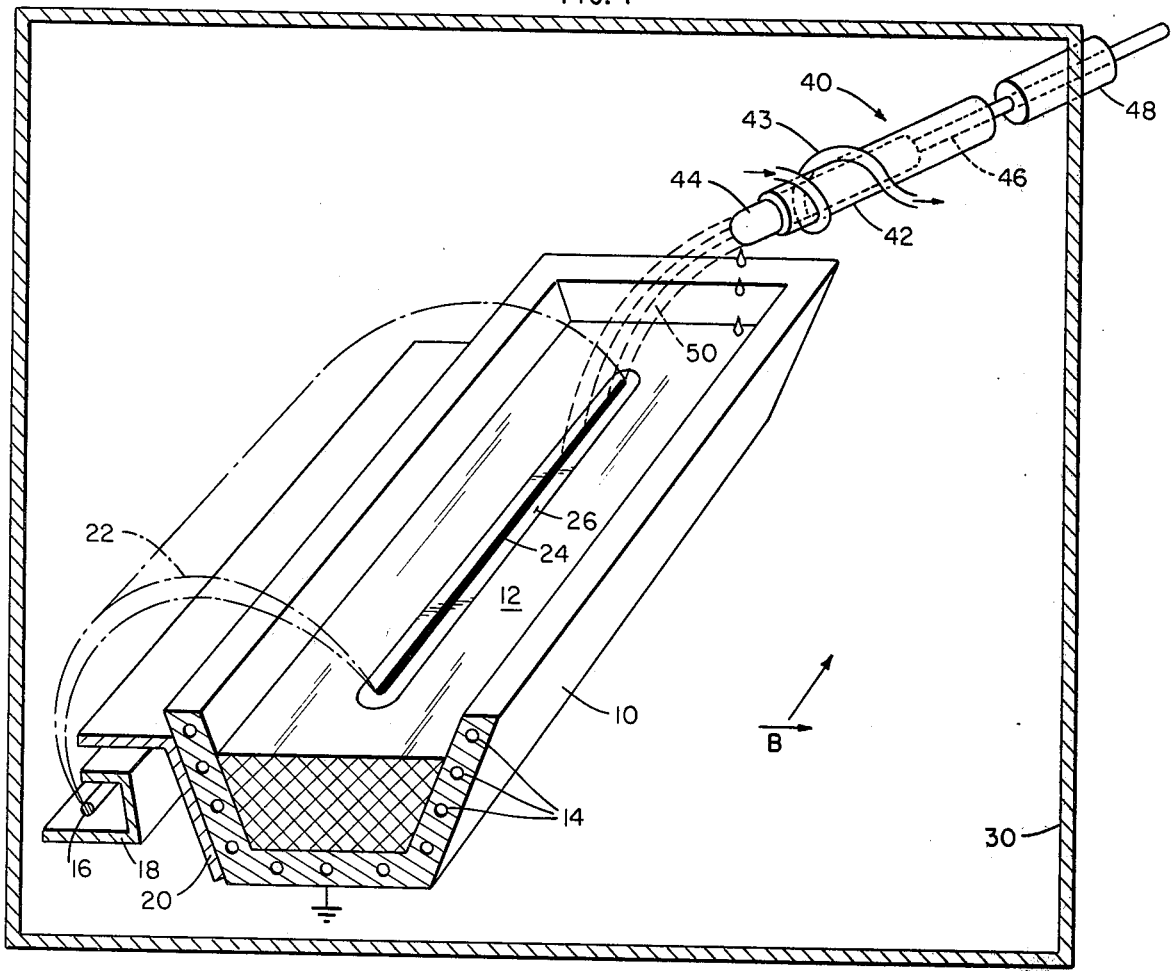
FIG. 1 is a diagrammatic, perspective view illustrating a preferred embodiment of the present invention.

Referring now to FIG. 1, there is shown, in diagrammatic form, a perspective illustration of a system for practicing the technique of the present invention. A crucible 10 provides a reservoir for containing material to be vaporized 12. This material will generally be a metal; in the particular isotope enrichment application of the invention described below, the material to be vaporized is uranium preferably mixed with particulate material as described in said U.S. Pat. No. 4,035,574 incorporated herein by reference. A number of isotopes of uranium are present in the source material; vaporization creates a gaseous environment in which the isotopes to be separated may be more readily processed. Crucible 10 is made of a metal which is a good heat conductor, such as copper. As shown by the sectional view through the end of the crucible in the foreground of FIG. 1, the crucible walls are provided with a plurality of channels or ports 14 through which water is flowed for cooling.

A primary electron beam for evaporating the uranium is provided by an electron gun assembly comprising a filament rod 16, a beam forming electrode 18, an accelerating anode 20, usually connected to the crucible, and power supplies for heating the filament (e.g. filament heater 56 of FIG. 3), biasing the beam forming electrode relative to the filament (e.g. bias supply 57), and providing an acceleration voltage between the filament and the anode (e.g. beam current source 58). Other electrodes known in the prior art may also be employed.

The heating of the filament rod 16 produces a thermal emission of electrons therefrom. An electric field is produced between filament rod 16 and acceleration anode 20 by the acceleration voltage applied therebetween. A magnetic field B is applied by a plurality of axially spaced coils, with the lines of flux thereof being directed parallel to the longitudinal axis of the crucible and normal to the trajectories of the primary electrons, as indicated. Such coils (e.g. coil 60), are energized by a magnetic field source power supply 61. This magnetic field occupies the entire region of the crucible and electron gun. The accelerated electrons in the presence of the magnetic field travel a focused arc, indicated generally by dashed lines 22, to impinge upon the surface of the source material 12. By adjusting the electric and magnetic field strengths as is known in the art, the region of impact of the electron beam on the surface of the source material is restricted to a narrow line 24 parallel to the longitudinal axis of the crucible. Most, or at least a significant amount, of the energy of the electron beam will be absorbed by the uranium source material 12 upon impact therewith, heating the uranium and melting a relatively small portion thereof in a region 26 surrounding the line 24 of impact of the electron beam. Region 26 is in turn surrounded by a multi-phase region into which uranium feed may be supplied. Thus, a liquefied pool of uranium is created in the crucible. Evaporation takes place at the surface of this heated pool, providing a vaporized flow of uranium away therefrom.

The crucible 10 is cooled, as mentioned above, by flowing a liquid through the ports in the walls thereof and extracting the heat from the fluid via conventional heat exchanging apparatus, not shown. The crucible thus acts as a heat sink and produces a temperature gradient in the source material. This serves, in part, to confine the molten pool to a small region around the line 24 of impact.

Figure 2:
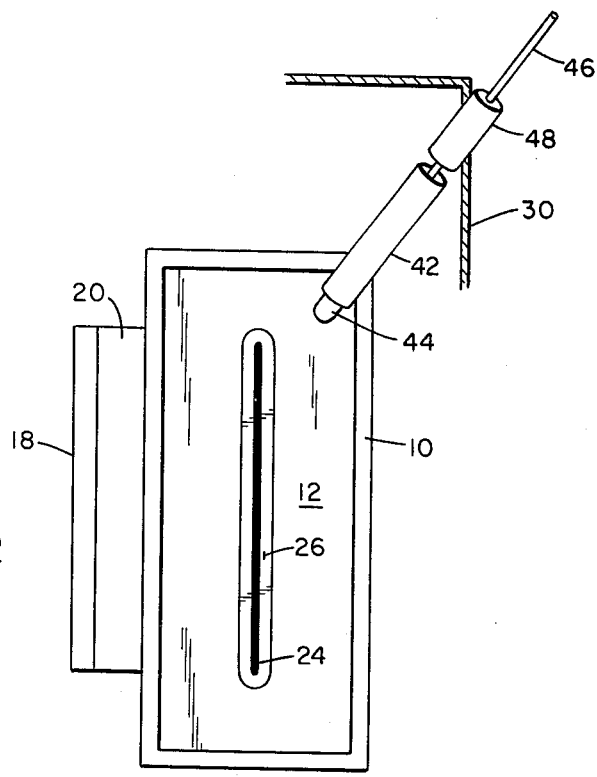
FIG. 2 is a top plan view of the apparatus of FIG. 1.
Figure 3:
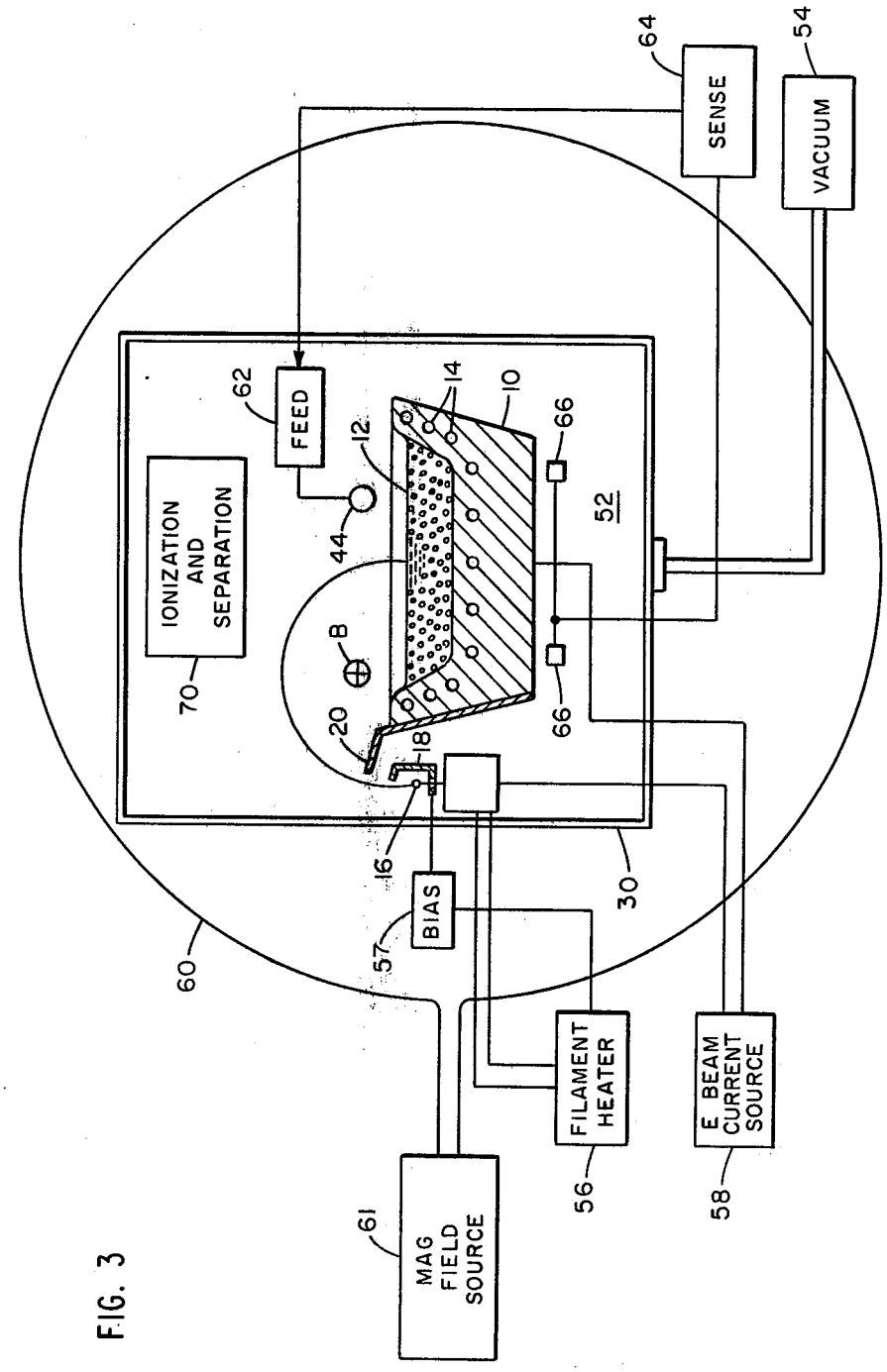
FIG. 3 is a diagrammatic, sectional illustration of the present invention as adapted to an isotopic enrichment system, with automatic feed control and melt level monitoring.

Continued operation and the attendant vaporization of uranium will eventually result in the depletion of the source material supply 12 in the reservoir. It is therefore desirable to be able to automatically replenish the supply of source material in the reservoir. This is also desirable for the reason that both the vapor source and the isotope collection apparatus associated therewith operate inside an evacuated and normally inaccessible region defined by a chamber of the type shown in U.S. Pat. No. 3,939,354 incorporated herein by reference. Thus, for purposes of illustration, there is shown in FIGS. 1 and 3 a wall 30 representing an evacuated enclosure of a typical operating chamber. While FIG. 2 shows only a segment of that wall, it is to be understood that the apparatus therein is similarly enclosed. The vacuum within the operating chamber is provided by conventional vacuum-producing apparatus 54.

This invention relates particularly to the supply of feedstock to the reservoir without having to open the vacuum-sealed operating chamber and, further, without interrupting processing or adversely affecting isotopic separation efficiency. To these ends, a feeder assembly 40 is provided. The feeder comprises a feed tube 42, feedstock 44, a feed rod 46, and a vacuum feed-through coupling or bushing 48. Though not shown as such, feed tube 42 may actually have a magazine associated therewith for storing multiple feed rods and supplying them one at a time to the feed tube.

Upon impacting with the source material 12, some of the electrons in the primary electron beam supplied by the electron gun, together with electrons freed from the source material, are emitted from the surface of the molten pool as skip or secondary electrons respectively. Due to the presence of the magnetic field, these skip or secondary, termed nonprimary, electrons follow trajectories contained within a radius of curvature determined in part, by the intensity of the magnetic field and in part by their energy and angle of emission. The feeder is supported by any suitable structure such that a portion of the feedstock 44 may be pushed out of the end of the feed tube 42 by the feed rod 46, to intercept the path of the secondarily emitted electrons, represented by dashed lines 50. The feedstock will thus be heated and melted by absorption of the energy of the intercepted electrons, causing it to drip into the interior of the reservoir. As noted above, the feed point at which the reservoir is supplied may be maintained at least as far from molten pool 26 as the dimensions of the multi-phase region in the crucible permit, so as not to distort the uniformity of vaporization.

Since it is necessary to confine the region of melting of the feedstock, feed tube 42 may be cooled, to provide a heat sink much like crucible 10. For this purpose, the feed tube 42 may be provided with cooling pipes 43. The cooling pipes are wrapped around and silver soldered to the feed tube and water is circulated through the cooling pipes to remove heat from the feed tube. From the cooling pipes the heated water is cooled in a heat exchanger or similar suitable apparatus and the cooled water is returned to the cooling pipes.

As the feedstock is melted and consumed in the process, additional feedstock is pushed out of the end of feed tube 42 by feed rod 46. Feed rod 46 extends from the point of contact with the feedstock, out of the end of the feed tube opposite that at which the feedstock is heated, and into vacuum feed-through 48, emerging from feed-through 48 externally to the processing chamber. This vacuum feedthrough also contains two internal seals with a separate pumpout facility between the two vacuum seals. The feed-through provides a vacuum-tight seal which permits limited motion of the feed rod without loss of vacuum within the operating chamber. The feed rod may be either manually or automatically driven, depending upon the user's needs.

Automatic operation of the feed mechanism is illustrated in a diagrammatic fashion in FIG. 3. As shown there, the level of source material 12 within the crucible is monitored as, for example, by a sense system 64 which detects from floor sensor 66 any changes in the weight of the melt 12. The sense system 64 provides a signal to a feed drive mechanism 62 to push the feed rod into the feed tube, thereby driving the feedstock into the field of the non-primary electrons. Thus, the source material for the melt is replenished in response to the detection of a reduction in weight of the melt. Feed drive 62 would, for example, comprise a motor drive connected to feed rod 46, as well as control circuitry for the motor. And, while sensors 66 are illustrated as weight sensors, any other suitable sensor arrangement for detecting changes in the level of the melt may be employed. For example, the level of the melt may be detected by reflecting a light beam off of the surface of the liquid pool and detecting the displacement of the reflected beam, or by sensing the amount of radiation over the pool. The former alternative is illustrated, for example, in U.S. Pat. No. Re 27,930, issued Feb. 26, 1974 as a reissue of U.S. Pat. No. 3,574,650 in the name of Randolph D. House, while the latter is illustrated, for example, in U.S. Pat. No. 3,668,386, issued June 6, 1972, in the name of S. S. Blecherman et al, both of which are assigned to United Aircraft Corporation. In the generalized isotope enrichment scheme illustrated in FIG. 3, the vapor containing multiple isotopes of, for example, uranium flows outwardly from the surface of the melt to be isotopically selectively excited and collected by ionization and separation equipment 70.

It should be understood from the foregoing description that precise placement of the feeder is not required for proper practice of the invention. Indeed, differences in source material characteristics will require differences in operating parameters. By way of example only, therefore, it is noted that for a uranium source, satisfactory melting of feedstock is achievable with about 90 kilowatts of power into a beam 18 cm in length.

Although the invention has been shown in the particular detailed embodiment discussed above as being adapted to uranium enrichment systems, it should be understood that it is of general application to any system in which an electron beam furnace consumes a source material by evaporation. Thus, it should be appreciated that the above-described embodiment for the present invention is illustrative only, alterations and modificatins being deemed to be within its spirit and scope. The breadth of the invention is therefore intended to be limited only as defined in the following claims.

What is claimed is:

1. In an electron beam evaporator of the type having a reservoir containing a supply of material to be evaporated and an electron beam which may be directed onto the surface of said material to produce vaporization thereof, a method for replenishing the supply of material in the reservoir comprising the steps of:
   providing a quantity of said material, in addition to the material in the reservoir, as feedstock;
   providing a stream of non-primary electrons emitted from the surface of the material in the reservoir from the impingement of the electron beam thereon; and,
   positioning said feedback so as to intercept said stream of non-primary electrons and outside of said electron beam directed onto the surface of said material;
   whereby a portion of the feedstock is melted by the stream of non-primary electrons, allowing it to drip into the reservoir, to replenish the supply of material which is depleted by vaporization.

2. The method of claim 1 further comprising the step of maintaining the feedstock at least partially over the reservoir such that a portion of the feedstock intercepts the trajectories of the electrons in the stream of non-primary electrons, to melt a portion of the feedstock.

3. The method of claim 1 further including the step of monitoring the level of material in the reservoir and supplying the feedstock to be heated responsively thereto, to maintain the level of material in the reservoir.

4. In a process for e-beam evaportion, the improvement for feeding material to be evaporated comprising the steps of:
   applying to a surface of said material an e-beam to produce vaporization of said material from a restricted region of said surface and to generate an electron skip field;
   melting a portion of feedstock of said material exclusively in said skip field over a portion of said surface removed from said restricted region sufficiently to prevent melting of the feedstock by heat from said restricted region.

5. The process of claim 4 wherein:
   a multi-phase region surrounds said restricted region; and
   said melting step includes the step of melting the portion of said feedstock to drip into said multi-phase region.

6. Apparatus for supplying feedstock to an electron beam evaporator of the type having a reservoir containing a supply of a material to be evaporated and an electron beam source providing a beam of electrons which is directed to impact on the surface of said material to produce vaporization thereof, said apparatus comprising:

feedstock;

means for producing a stream of non-primary electrons emitted from the surface of the material in the reservoir from the application thereto of the electron beam;

means for maintaining at least a portion of the feedstock above the material in the reservoir to exclusively intercept the trajectories of a portion of said stream of non-primary electrons, whereby said stream of electrons produces heating and melting of the feedstock which then drips into the material supply in the reservoir; and the position at which the feedstock is maintained and intercepts said stream of non-primary electrons is sufficiently removed from the region of electron impact on the surface of the material in the reservoir such that the vaporization of the material in the reservoir is substantially uniform throughout such region.

7. The apparatus of claim 6 wherein the feedstock comprises a rod of material of the same type as the supply of material to be evaporated and said apparatus further includes means for removing heat from said rod to confine the melting thereof to the portion of the rod maintained above the resevoir.

8. The apparatus of claim 7 wherein the means for removing heat from the rod of feedstock comprises a cooled tube at least partially enclosing said rod and providing a heat sink therefor.

9. The apparatus of claim 8 further including a vacuum chamber surrounding said electron beam evaporator and means exterior to said chamber for pushing the rod of feedstock out of the tube and into the stream of non-primary electrons.

10. The apparatus of claim 9 further including means for activating said pushing means responsive to the level of material in the reservoir.

11. A process for feeding evaporant to an electron beam evaporator having a magnetically directed, primary linear electron beam which strikes a supply of said evaporant within a container to cause evaporation along a line of said supply, and produce a non-primary electron beam therefor, the process including the steps of:

directing a feedstock of said evaporant into said non-primary electron beam above said supply without contacting said primary electron beam with said feedstock;

melting an end portion of said feedstock exclusively with said non-primary electron beam; and limiting the melting of said feedstock to said end portion in said secondary electron beam.

12. The process of claim 11 wherein:
said supply includes a multi-phase region; and
said directing step includes directing said feedstock above said multi-phase zone.

13. The process of claim 11 wherein:
said limiting step includes the step of cooling the feedstock beyond said end portion.

* * * * *

UNITED STATES PATENT AND TRADEMARK OFFICE
CERTIFICATE OF CORRECTION

PATENT NO. : 4,262,160
DATED : April 14, 1981
INVENTOR(S) : Robert H. McKoon, et al It is certified that error appears in the above—identified patent and that said Letters Patent is hereby corrected as shown below:

Column 2, line 13, "sustantial" should read --substantial--.

Column 3, line 57, "field B" should read --field $\overline{B}$--.

Column 6, line 9, "modificatins" should read --modifications--.

Column 6, line 26, "feedback" should read --feedstock--.

Signed and Sealed this

Tenth Day of November 1981

[SEAL]

Attest:

Attesting Officer

GERALD J. MOSSINGHOFF

Commissioner of Patents and Trademarks